(12) United States Patent
Inatani et al.

(10) Patent No.: US 12,745,474 B2
(45) Date of Patent: Sep. 22, 2026

(54) PHOTOELECTRIC CONVERSION APPARATUS AND EQUIPMENT

(71) Applicant: CANON KABUSHIKI KAISHA, Tokyo (JP)

(72) Inventors: Naoki Inatani, Tokyo (JP); Shunya Kamioka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 351 days.

(21) Appl. No.: 18/610,671

(22) Filed: Mar. 20, 2024

(65) Prior Publication Data

US 2024/0321920 A1 Sep. 26, 2024

(30) Foreign Application Priority Data

Mar. 22, 2023 (JP) ................................ 2023-045117

(51) Int. Cl.
*H10F 39/00* (2025.01)

(52) U.S. Cl.
CPC ..... *H10F 39/8063* (2025.01); *H10F 39/8023* (2025.01); *H10F 39/8057* (2025.01)

(58) Field of Classification Search
CPC ............. H10F 39/8063; H10F 39/8023; H10F 39/8057
See application file for complete search history.

(56) References Cited

U.S. PATENT DOCUMENTS

| | | | | |
|---|---|---|---|---|
| 10,014,338 | B2 * | 7/2018 | Lee | H10F 39/8063 |
| 12,568,697 | B2 * | 3/2026 | Jeong | H10F 39/18 |

FOREIGN PATENT DOCUMENTS

| | | | |
|---|---|---|---|
| JP | 2007281047 | A | 10/2007 |
| JP | 2013012506 | A | 1/2013 |
| JP | 2014154755 | A | 8/2014 |
| WO | 2020137203 | A1 | 7/2020 |

* cited by examiner

*Primary Examiner* — Dale E Page
*Assistant Examiner* — Wilner Jean Baptiste
(74) *Attorney, Agent, or Firm* — Canon U.S.A., Inc. IP Division

(57) ABSTRACT

A photoelectric conversion apparatus includes a substrate, a planarizing layer, and first and second intra-layer lenses. The substrate includes first and second surfaces and is provided with pixels, each including a photoelectric converter between the first and second surfaces. The first intra-layer lens is located at a position overlapping with at least part of the photoelectric converter in plan view with respect to the first surface. At least part of the second intra-layer lens is located within a depth between an upper and a lower end of the first intra-layer lens. The second intra-layer lens is disposed between a plurality of the photoelectric converters adjacent to each other in the plan view with respect to the first surface, and the second intra-layer lens further is disposed in a direction of an extension of a diagonal of one of the pixels in the plan view with respect to the first surface.

21 Claims, 11 Drawing Sheets

IIB
IIC
2
10
120
121
122
133
100
101
102
110
111
112
113
123
130
131
132
20
30

IIIB
IIIC
133
121
120
122
10
2
131
130
123
112
110
111
20
113
101
102
100
30
132

IVB
IVC
122
120
121
133
126
10
2
131
130
123
112
110
111
20
113
101
102
100
30
132

133
202
121
120
201
122
VC
VB
10
2
203
131
130
123
112
110
111
20
113
101
102
100
30
132

VIB
VIC
2
10
100
101
102
110
111
112
113
120
121
122
123
126
130
131
132
133
20
30
201
202
203
204

VIIB
VIIC
133
131
130
121
123
120
112
110
111
20
113
101
102
100
30
10
2
122
132
201
203

133
121
120
122
10
2
VIIIB
VIIIC
131
130
123
20
101
100
30
110
111
132

PHOTOELECTRIC CONVERSION APPARATUS AND EQUIPMENT

BACKGROUND

Field

The present disclosure relates to a photoelectric conversion apparatus and equipment.

Description of the Related Art

There is a known photoelectric conversion apparatus including an intra-layer lens to improve the optical properties such as sensitivity. International Patent Publication No. JPWO2020/137203 discloses an image sensor in which a plurality of intra-layer lenses is disposed above a photoelectric converter contained in a pixel. However, depending on the pixel pitch and the shape of the intra-layer lenses, the flatness of the layer on top of the intra-layer lenses may become worse.

For example, if a gap between adjacent intra-layer lenses, such as a gap between intra-layer lenses that are adjacent in the diagonal direction of the pixel, is large, the flatness of the layer on top of the intra-layer lenses may become worse.

SUMMARY

The present disclosure provides a photoelectric conversion apparatus with improved flatness of the layer provided on top of the intra-layer lenses.

According to an aspect of the present disclosure, a photoelectric conversion apparatus includes a substrate including a first surface and a second surface, wherein the substrate is provided with a plurality of pixels, each including a first photoelectric converter between the first surface and the second surface, a planarizing layer adjacent to the first surface of the substrate, a first intra-layer lens between the planarizing layer and the substrate, and a second intra-layer lens between the planarizing layer and the substrate, wherein the first intra-layer lens is located at a position overlapping with at least part of the first photoelectric converter in a plan view with respect to the first surface, wherein at least part of the second intra-layer lens is located within a depth between an upper end and a lower end of the first intra-layer lens, and wherein the second intra-layer lens is disposed between a plurality of the first photoelectric converters adjacent to each other in the plan view with respect to the first surface, and the second intra-layer lens further is disposed in a direction of an extension of a diagonal of one of the plurality of pixels in the plan view with respect to the first surface.

Further features of the present disclosure will become apparent from the following description of exemplary embodiments with reference to the attached drawings.

BRIEF DESCRIPTION OF THE DRAWINGS

FIG. 9A is a plan view of a photoelectric conversion apparatus according to a modification of the fourth embodiment.

FIGS. 9B and 9C are cross-sectional views of the photoelectric conversion apparatus according to the modification of the fourth embodiment.

DESCRIPTION OF THE EMBODIMENTS

Figure 1:
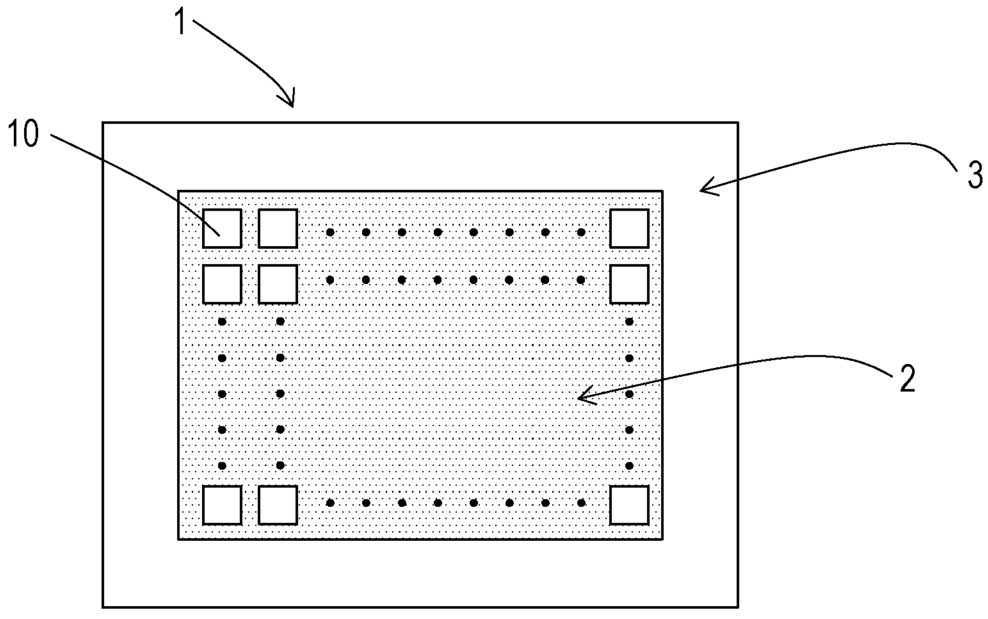
FIG. 1 is a plan view of a photoelectric conversion apparatus according to a first embodiment.

Embodiments will be described hereinbelow with reference to the drawings. The following embodiments are not intended to limit the disclosure according to the claims. The embodiments describe a plurality of features, but not all of the features are required for the disclosure. The features may be freely combined. In the attached drawings, the same or similar components are given the same reference signs, and duplicated descriptions will be omitted. The embodiments mainly describe sensors for image capturing as examples of the photoelectric conversion apparatus. The embodiments are applicable not only to the sensors for image capturing but also to other examples of the photoelectric conversion apparatus. Examples include image capturing apparatuses, distance measuring apparatuses (apparatuses for measuring distance using focus detection or Time Of Flight (TOF)) and photometric apparatuses (apparatuses for measuring incident light amount).

In this specification, terms indicating specific directions or locations (for example, “top” “bottom”, “right”, “left”, and other terms containing these terms) are used as needed.

It is to be understood that these terms are used to facilitate understanding the embodiments with reference to the drawings and that the technical scope of the present disclosure is not limited by the meaning of these terms.

In this specification, "electrically connecting component A and component B" is not limited to "directly connecting component A and component B". For example, component A and component B only have to be electrically connected even with another component C therebetween.

In this specification, "flat surface" refers to a surface parallel to the principal surface of the substrate. The principal surface of the substrate may be a light incident surface of the substrate including a photoelectric conversion element, a surface on which a plurality of analog-to-digital converters (ADCs) is repeatedly arranged, or the joining surface between the substrates of a laminated photoelectric conversion apparatus. The term "plan view" refers to a view from the direction perpendicular to the principal surface of the substrate. The term "cross section" refers to a surface perpendicular to the light incident surface of a semiconductor layer. The term "cross-sectional view" refers to a view from the direction parallel to the principal surface of the substrate.

The metallic components, such as wiring lines and pads, described in this specification may be either a single element metal or a mixture (alloy). For example, a wiring line described as a copper wiring line may be made of elemental copper or may principally contain copper and additionally contain another component. For example, a pad connected to an external terminal may be made of elemental aluminum or may principally contain aluminum and additionally contain another component. The copper wiring line and the aluminum pad here are illustrative only, and a variety of metals are applicable. The wiring line and the pad are mere examples of metallic components used in photoelectric conversion apparatuses, and other metallic components are applicable.

First Embodiment

A photoelectric conversion apparatus 1 according to a first embodiment of the present disclosure will be described with reference to FIG. 1 and FIGS. 2A to 2C.

FIG. 1 is an example of a plan view of the photoelectric conversion apparatus 1 according to this embodiment.

As illustrated in FIG. 1, the photoelectric conversion apparatus 1 includes a pixel region 2 and a peripheral region 3 around the pixel region 2. The pixel region 2 includes pixels 10 for photoelectrically converting incident light in two dimensions of m rows and n columns. Signals output from the pixels 10 are used to generate images. In the peripheral region 3, for example, a driving-signal generation circuit for driving the pixels 10, an analog-to-digital (A/D) conversion circuit for converting the signals output from the pixels 10 from analog to digital, and an output circuit for outputting the analog-to-digital converted signals.

Figures 2A, 2B, 2C:
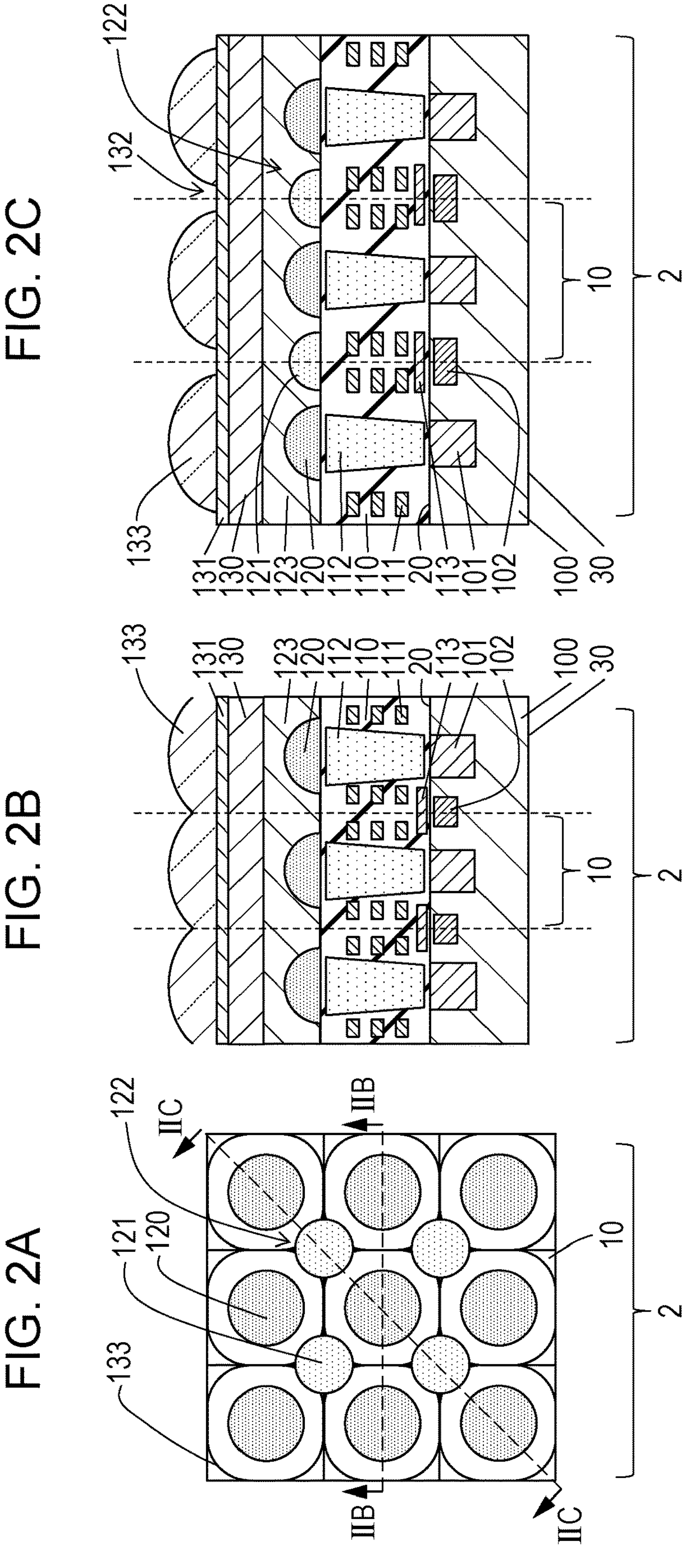
FIG. 2A is a plan view of the photoelectric conversion apparatus according to the first embodiment.
FIGS. 2B and 2C are cross-sectional views of the photoelectric conversion apparatus according to the first embodiment.

FIG. 2A and FIGS. 2B and 2C are examples of a plan view and a cross-sectional view of the pixel region 2 of the photoelectric conversion apparatus 1 according to this embodiment, respectively.

FIG. 2A illustrates an example of a plan view of the pixel region 2. The pixel region 2 includes a substrate 100 having a first surface 20 and a second surface 30 (described in detail below with reference to FIG. 2B). FIG. 2A is a plan view of the pixel region 2 seen from the first surface 20, which is a light incident surface.

As shown in FIG. 2A, the pixel region 2 includes the pixels 10, first intra-layer lenses 120, second intra-layer lenses 121, and first microlenses 133. The first intra-layer lenses 120 and the first microlenses 133 are disposed at about a center of each pixel 10 in plan view with respect to the first surface 20. Each first microlens 133 is disposed at a position overlapping with at least part of each first intra-layer lens 120 and at least part of each second intra-layer lens 121 in plan view with respect to the first surface 20.

The second intra-layer lenses 121 are each disposed in a first gap 122 provided between the plurality of first intra-layer lenses 120 adjacent in the diagonal direction of the pixel 10 in plan view with respect to the first surface 20. In other words, the second intra-layer lenses 121 are disposed in the direction of the extension of the diagonal of the pixels 10 in plan view with respect to the first surface 20. For example, at least part of each second intra-layer lens 121 and the extension of the diagonal of each pixel 10 overlap in plan view with respect to the first surface 20. The second intra-layer lens 121 is disposed between the adjacent first microlenses 133 in plan view with respect to the first surface 20. The second intra-layer lens 121 is disposed at a position overlapping with the adjacent pixels 10 in plan view with respect to the first surface 20. The diameter of the second intra-layer lens 121 is less than or equal to the diameter of each first intra-layer lens 120 in plan view with respect to the first surface 20.

FIG. 2B illustrates an example of a cross-sectional view of the pixel region 2 of FIG. 2A taken along line IIB-IIB, which is the direction of the opposite sides of the pixel 10.

As shown in FIG. 2B, the pixel region 2 includes the substrate 100, a wiring layer 110 including wiring lines 111, the first intra-layer lenses 120, a first planarizing layer (a planarizing layer) 123, and the first microlenses 133. The substrate 100 has the first surface 20 and the second surface 30. The plurality of pixels 10 each including the first photoelectric converter 101 is disposed between the first surface 20 and the second surface 30. The wiring layer 110, the first intra-layer lenses 120, the first planarizing layer 123, and the first microlenses 133 are disposed adjacent to the first surface 20 of the substrate 100. The wiring layer 110 is disposed between the first intra-layer lenses 120 and the substrate 100. The first intra-layer lenses 120 are disposed between the first planarizing layer 123 and the substrate 100. The first planarizing layer 123 is disposed between the plurality of first microlenses 133 and the substrate 100.

FIG. 2C illustrates an example of a cross-sectional view of the pixel region 2 of FIG. 2A taken along line IIC-IIC, which is the direction of a diagonal of the pixel 10.

As shown in FIG. 2C, the pixel region 2 includes, in addition to the configuration shown in FIG. 2B, the second intra-layer lenses 121 each disposed in each first gap 122 provided between the first intra-layer lenses 120 adjacent in the diagonal direction of the pixel 10. Each second intra-layer lens 121 is disposed below a second gap 132 provided between the first microlenses 133 adjacent in the diagonal direction of the pixel 10. At least one of an end (the upper end) of each second intra-layer lens 121 adjacent to the planarizing layer 123 and an end (the lower end) adjacent to the substrate 100 is disposed within a depth between an end (the upper end) of each first intra-layer lens 120 adjacent to the planarizing layer 123 and an end (the lower end) adjacent to the substrate 100.

In other words, at least part of the second intra-layer lens 121 is located within the depth between the end of the first intra-layer lens 120 adjacent to the planarizing layer 123 and the end adjacent to the substrate 100. The end of the second intra-layer lens 121 adjacent to the planarizing layer 123 and the end adjacent to the substrate 100 may be located within the depth between the end of the first intra-layer lens 120 adjacent to the planarizing layer 123 and the end adjacent to the substrate 100.

Referring to FIGS. 2A and 2B, each first intra-layer lens 120 is disposed at a position overlapping with at least part of each first photoelectric converter 101 in plan view with respect to the first surface 20.

Referring to FIGS. 2A and 2C, each second intra-layer lens 121 is disposed between the adjacent first photoelectric converters 101 in plan view with respect to the first surface 20.

The pixel region 2 may include a charge accumulation unit 102, an optical waveguide 112, a light-shielding film 113, color filters 130, and a second planarizing layer 131. As shown in FIGS. 2A to 2C, the optical waveguide 112, the light-shielding film 113, the color filters 130, and the second planarizing layer 131 are disposed adjacent to the first surface 20 of the substrate 100. The charge accumulation unit 102 is disposed in the substrate 100. The second intra-layer lens 121 is disposed at a position overlapping with at least part of the charge accumulation unit 102 in plan view with respect to the first surface 20. The optical waveguide 112 is disposed in the wiring layer 110. The first intra-layer lens 120 is disposed at a position overlapping with at least part of the optical waveguide 112 in plan view with respect to the first surface 20. The light-shielding film 113 is disposed in the wiring layer 110. The second intra-layer lens 121 is disposed at a position overlapping with at least part of the light-shielding film 113 in plan view with respect to the first surface 20. The color filters 130 are disposed adjacent to the first surface 20 of the substrate 100. The first planarizing layer 123 is disposed between the color filters 130 and the first intra-layer lenses 120. The second planarizing layer 131 is disposed between the color filters 130 and the first microlenses 133.

One example of the first photoelectric converter 101 is a photodiode. The first photoelectric converter 101 receives light incident on the pixel 10 and generates a signal charge corresponding to the incident light. The signal charge generated in the first photoelectric converter 101 is transferred to a floating diffusion unit (not shown) by the activation of a transfer transistor (not shown) and is read as a voltage signal. The floating diffusion unit functions as a charge-voltage converter that temporarily holds the signal charge input from the photoelectric converter 10 and converts the held signal charge to a voltage signal.

The wiring lines 111 are electrically connected to the substrate 100 and transistors (not shown). The wiring layer 110 insulates the wiring lines 111 and the terminals of the transistors (not shown). The wiring layer 110 includes, for example, a silicon oxide film.

The first intra-layer lens 120 is disposed to collect incident light to the optical waveguide 112 and the first photoelectric converter 101. The first intra-layer lens 120 contains, for example, silicon nitride. The silicon nitride constituting the first intra-layer lens 120 is manufactured using a known semiconductor manufacturing process, formed through processes such as exposure with masks, reflow, and etching. The first intra-layer lens 120 may contain silicon oxynitride.

As shown in FIGS. 2A to 2C, the first intra-layer lenses 120 and the second intra-layer lenses 121 are hemispherical and are circular in plan view with respect to the first surface 20. Because of such a shape, the first intra-layer lenses 120 and the second intra-layer lenses 121 are convex lenses with a positive power designed to collect incident light. The first intra-layer lenses 120 and the second intra-layer lenses 121 may contain silicon nitride. The first intra-layer lenses 120 and the second intra-layer lenses 121 may contain silicon oxynitride. In other words, the first intra-layer lenses 120 and the second intra-layer lenses 121 may contain the same material.

The first planarizing layer 123 is disposed over the first intra-layer lenses 120 and the second intra-layer lenses 121. The first planarizing layer 123 is manufactured using a known semiconductor manufacturing process, for example, through spin coating of a transparent resin-based resist, or deposition of a silicon oxide film or a silicon nitride film followed by chemical mechanical polishing (CMP).

The charge accumulation unit 102 functions to accumulate signal charges generated by the first photoelectric converter 101 by the activation of the transfer transistor (not shown).

The optical waveguide 112 functions to guide incident light to the first photoelectric converter 101. The optical waveguide 112 contains, for example, silicon nitride. The silicon nitride constituting the optical waveguide 112 is manufactured using a known semiconductor manufacturing process, such as a chemical vapor deposition (CVD) method. The wiring layer 110 around the optical waveguide 112 is made of silicon oxide film, as described above, which has a lower refractive index than silicon nitride. For this reason, the light incident on the optical waveguide 112 is totally reflected by the side surface of the optical waveguide 112 into the first photoelectric converter 101.

The light-shielding film 113 minimizes or eliminates the incidence of light onto the charge accumulation unit 102, thereby minimizing or eliminating generation of electric charges in the charge accumulation unit 102 to cause noise. The light-shielding film 113 contains, for example, metal.

The color filters 130 are optical filters with, for example, Bayer arrangement, in the pixel region 2 and having transmission wavelength characteristics corresponding to R, G, and B. The second planarizing layer 131 is disposed to planarize the surface irregularities of the color filters 130 due to the difference in thickness among the R, G, and B filters.

The first microlens 133 collects the incident light to the first intra-layer lens 120 and the optical waveguide 112 to thereby improve the light receiving sensitivity of the first photoelectric converter 101.

In this embodiment, the second intra-layer lens 121 is disposed in the first gap 122, which decreases the spatial volumes of the first gaps 122 to be planarized in the process of forming the first planarizing layer 123, described above. This facilitates filling the first gaps 122 with the first planarizing layer 123, thereby improving the flatness of the first planarizing layer 123.

Thus, in this embodiment, the flatness of the layer provided over the first intra-layer lenses 120 can be improved by disposing the second intra-layer lens 121 between the plurality of first intra-layer lenses 120 adjacent in the diagonal direction of the pixel 10. The layer provided over the first intra-layer lenses 120, whose flatness is improved, includes at least the first planarizing layer 123 and can further include the color filters 130, the second planarizing layer 131, and the first microlenses 133.

In the case of a configuration without the second intra-layer lenses 121, the flatness of the layer provided over the first intra-layer lenses 120 can be improved by increasing the thickness of the transparent-resin-based resist or the thickness of the silicon oxide film or the silicon nitride film. However, this configuration increases the distance between the first intra-layer lenses 120 and the first microlenses 133, causing constraints on the optical design. As measures against this issue, the thickness of the layer provided over the first intra-layer lenses 120 can be adjusted by etching back the entire surface of the transparent resin film or CMP processing on the silicon oxide film or the silicon nitride film. However, this requires additional processes.

However, this embodiment can form the first intra-layer lenses 120 and the second intra-layer lenses 121 in the same layer with the same material using the same process using a mask pattern. This eliminates the need for adding a new process for improving the flatness of the layer provided over the first intra-layer lenses 120. The first intra-layer lenses 120 and the second intra-layer lenses 121 may be manufactured in separate processes. This also gives the effect of improving the flatness of the layer provided over the first intra-layer lenses 120.

In this embodiment, the first intra-layer lenses 120, the color filters 130, and the first microlenses 133 are each disposed at about a center of each pixel 10, and each second intra-layer lens 121 is disposed between the first photoelectric converters 101. Alternatively, depending on the image heights of the pixels 10, the positions of the first intra-layer lens 120, the color filter 130, and the first microlens 133 may be gradually disposed off the pixel center in plan view with respect to the first surface 20. The principal ray of an image capturing lens (not shown) is inclined with an increasing distance from the optical center of the photoelectric conversion apparatus. For this reason, the first intra-layer lens 120, the color filter 130, and the first microlens 133 may be disposed off the optical center.

In this embodiment, the second intra-layer lenses 121 are circular in plan view with respect to the first surface 20 and semicircular in cross sectional view. This is illustrative only. The shape of the second intra-layer lenses 121 can be selected based on the shape of the first intra-layer lenses 120 and the width of the first gap 122. Selecting a mask pattern based on the desired optical design allows for forming the first intra-layer lenses 120 and the second intra-layer lenses 121 with different shapes. The mask may be a binary mask or a gradation mask based on the pattern to be formed.

A photoelectric conversion apparatus according to a first modification of the first embodiment of the present disclosure will be described with reference to FIGS. 3A to 3C. The components corresponding to those in the first embodiment are denoted by the same reference signs, and descriptions thereof may be omitted or simplified.

The first modification of the first embodiment differs from the first embodiment in the shape of the second intra-layer lenses 121. FIGS. 3A and FIGS. 3B and 3C are examples of a plan view and a cross-sectional view of the pixel region of the photoelectric conversion apparatus according to this modification, respectively.

Figures 3A, 3B, 3C:
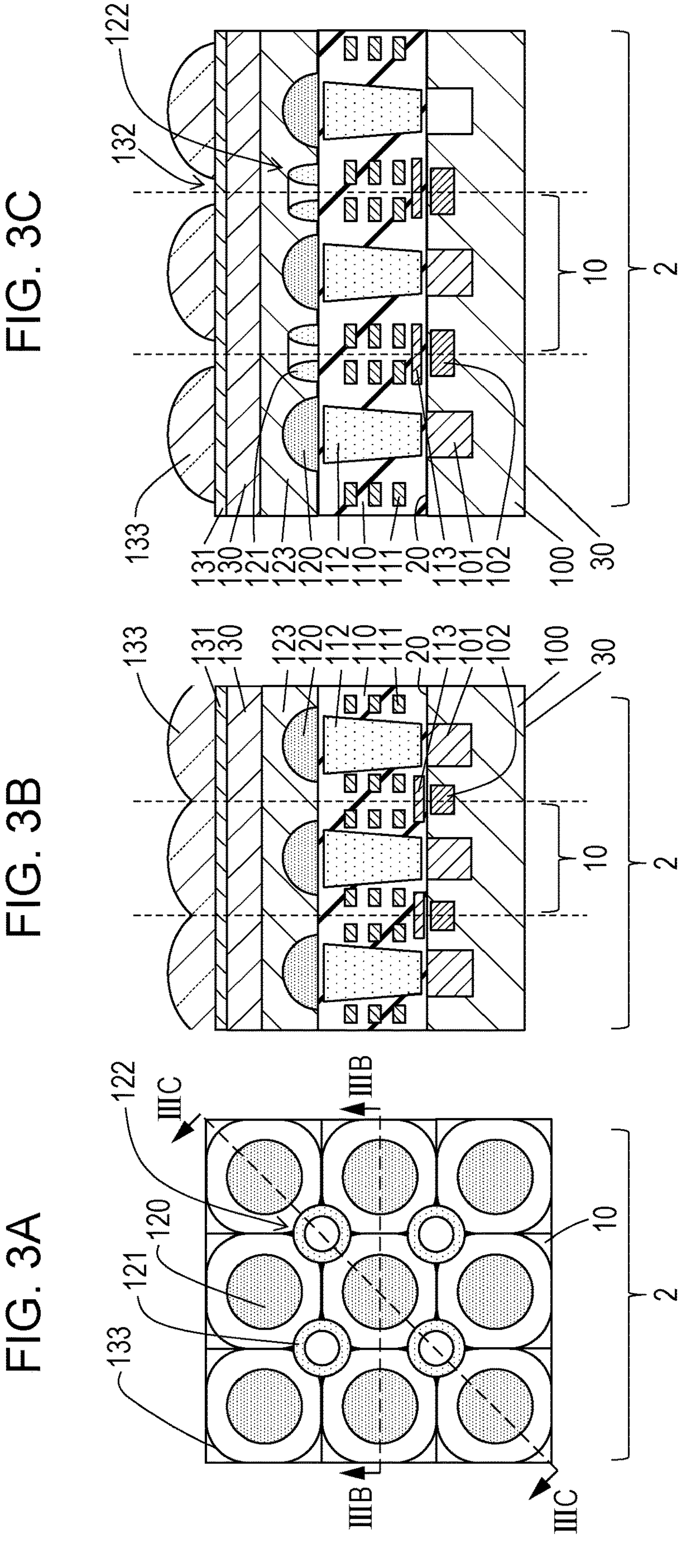
FIG. 3A is a plan view of a photoelectric conversion apparatus according to a modification of the first embodiment.
FIGS. 3B and 3C are cross-sectional views of the photoelectric conversion apparatus according to the modification of the first embodiment.

FIG. 3A illustrates an example of a plan view of the pixel region 2 seen from the first surface 20.

FIG. 3B illustrates an example of a cross-sectional view of the pixel region 2 of FIG. 3A taken along line IIIB-IIIB, which is the direction of the opposite sides of the pixel 10. FIG. 3C illustrates an example of a cross-sectional view of the pixel region 2 of FIG. 3A taken along line IIIC-IIIC, which is the direction of a diagonal of the pixel 10.

As shown in FIGS. 3A to 3C, the second intra-layer lenses 121 are each disposed in the first gap 122 provided between the plurality of first intra-layer lenses 120 adjacent in the diagonal direction of the pixel 10 in plan view with respect to the first surface 20. The second intra-layer lenses 121 have an annular shape such as a toroidal shape, with a doughnut shape in plan view with respect to the first surface 20 and a toroidal shape in cross-sectional view.

Thus, in this modification, the flatness of the layer provided over the first intra-layer lenses 120 can be improved by disposing the second intra-layer lens 121 between the plurality of first intra-layer lenses 120 adjacent in the diagonal direction of the pixel 10.

Furthermore, this modification selects an appropriate shape for the second intra-layer lenses 121 based on the shape of the first intra-layer lenses 120 in consideration of the lens volume and etching processability. This configuration decreases the spatial volumes of the first gaps 122 to be planarized.

This facilitates filling the first gaps 122 with the first planarizing layer 123, thereby further improving the flatness of the layer provided over the first intra-layer lenses 120.

A photoelectric conversion apparatus according to a second modification of the first embodiment of the present disclosure will be described with reference to FIGS. 4A to 4C. The components corresponding to those in the first embodiment are denoted by the same reference signs, and descriptions thereof may be omitted or simplified.

The second modification of the first embodiment differs from the first embodiment in the shape of the second intra-layer lenses 121. FIGS. 4A and FIGS. 4B and 4C are examples of a plan view and a cross-sectional view of the pixel region of the photoelectric conversion apparatus according to this modification, respectively.

Figures 4A, 4B, 4C:
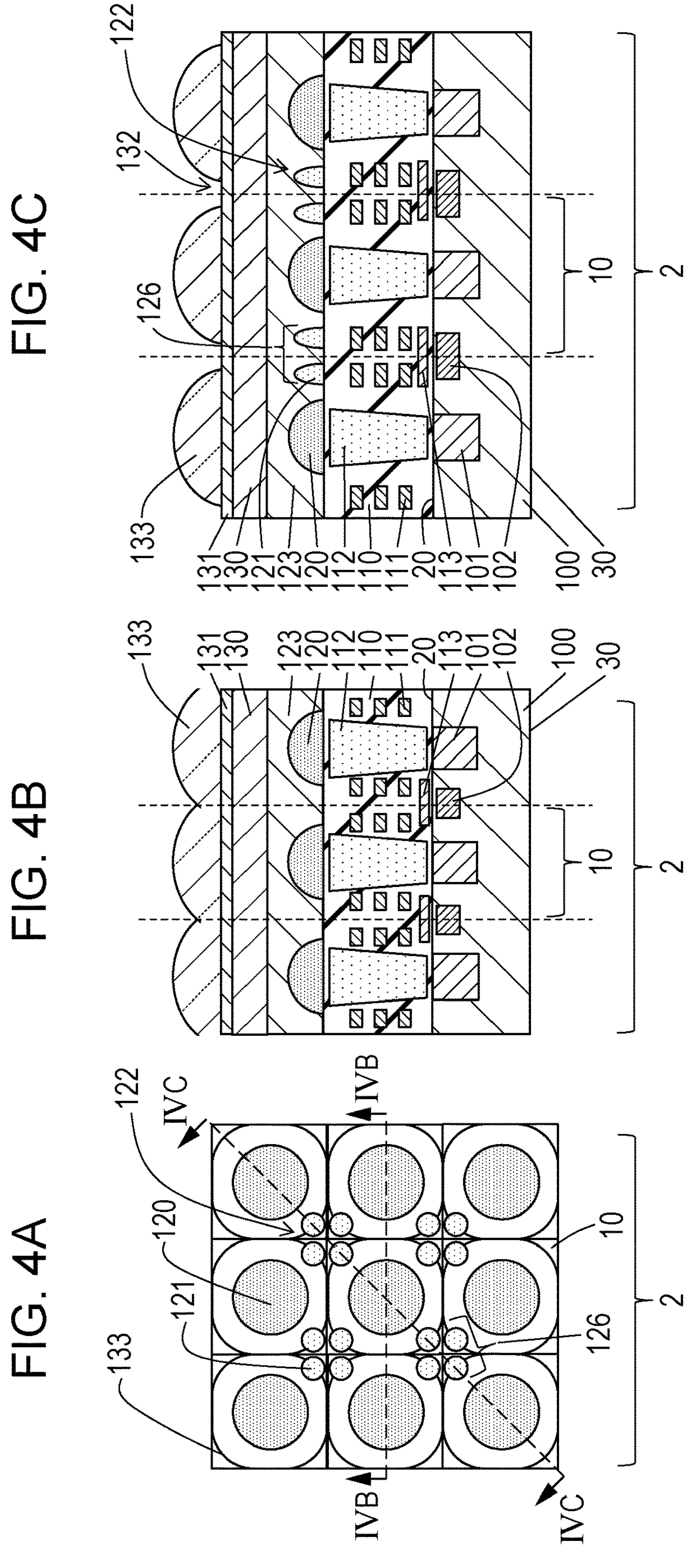
FIG. 4A is a plan view of a photoelectric conversion apparatus according to a second modification of the first embodiment.
FIGS. 4B and 4C are cross-sectional views of the photoelectric conversion apparatus according to the second modification of the first embodiment.

FIG. 4A illustrates an example of a plan view of the pixel region 2 seen from the first surface 20.

FIG. 4B illustrates an example of a cross-sectional view of the pixel region 2 of FIG. 4A taken along line IVB-IVB, which is the direction of the opposite sides of the pixel 10. FIG. 4C illustrates an example of a cross-sectional view of the pixel region 2 of FIG. 4A taken along line IVC-IVC, which is the direction of a diagonal of the pixel 10.

As shown in FIGS. 4A to 4C, the second intra-layer lenses 121 are each disposed in the first gap 122 provided between the plurality of first intra-layer lenses 120 adjacent in the diagonal direction of the pixel 10 in plan view with respect to the first surface 20. The second intra-layer lenses 121 are circular in plan view with respect to the first surface 20 and semicircular in cross-sectional view. The second intra-layer lenses 121 constitute a second intra-layer lens unit 126.

Thus, in this modification, the flatness of the layer provided over the first intra-layer lenses 120 can be improved by disposing the second intra-layer lens 121 between the plurality of first intra-layer lenses 120 adjacent in the diagonal direction of the pixel 10.

Furthermore, this modification selects an appropriate shape for the second intra-layer lenses 121 based on the shape of the first intra-layer lenses 120 in consideration of the lens volume and etching processability. This configuration decreases the spatial volumes of the first gaps 122 to be planarized.

This facilitates filling the first gaps 122 with the first planarizing layer 123, thereby further improving the flatness of the layer provided over the first intra-layer lenses 120.

The number of the second intra-layer lenses 121 constituting the second intra-layer lens unit 126 may be any number.

Second Embodiment

A photoelectric conversion apparatus according to a second embodiment of the present disclosure will be described with reference to FIGS. 5A to 5C. The components corresponding to those in the first embodiment are denoted by the same reference signs, and descriptions thereof may be omitted or simplified.

This embodiment differs from the first embodiment in that third intra-layer lenses 202 are provided in addition to the second intra-layer lens 121. FIGS. 5A and FIGS. 5B and 5C are examples of a plan view and a cross-sectional view of the pixel region of the photoelectric conversion apparatus according to this embodiment, respectively.

Figures 5A, 5B, 5C:
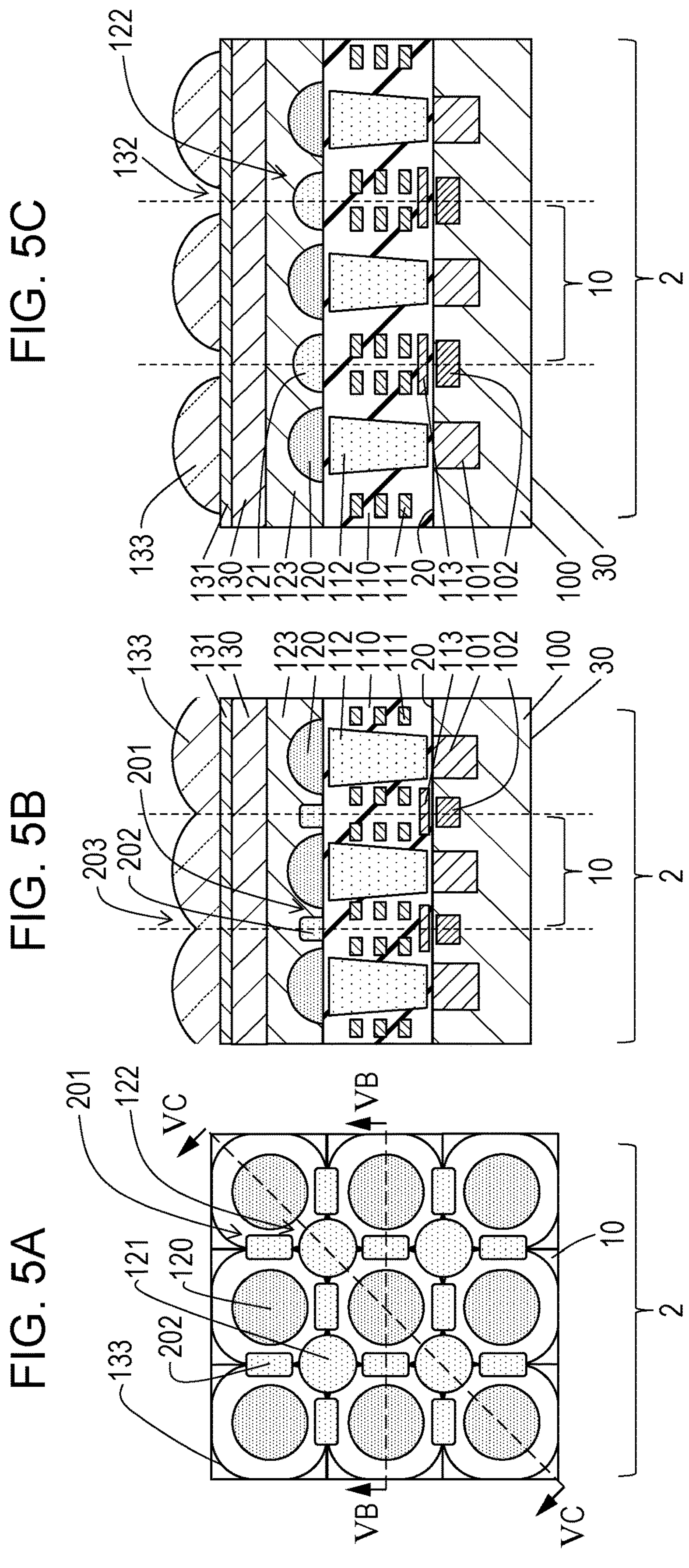
FIG. 5A is a plan view of a photoelectric conversion apparatus according to a second embodiment.
FIGS. 5B and 5C are cross-sectional views of the photoelectric conversion apparatus according to the second embodiment.

FIG. 5A illustrates an example of a plan view of the pixel region 2 seen from the first surface 20.

FIG. 5B illustrates an example of a cross-sectional view of the pixel region 2 of FIG. 5A taken along line VB-VB, which is the direction of the opposite sides of the pixel 10. FIG. 5C illustrates an example of a cross-sectional view of the pixel region 2 of FIG. 5A taken along line VC-VC, which is the direction of a diagonal of the pixel 10.

As shown in FIGS. 5A to 5C, the second intra-layer lenses 121 are each disposed in the first gap 122 provided between the plurality of first intra-layer lenses 120 adjacent in the diagonal direction of the pixel 10 in plan view with respect to the first surface 20. The third intra-layer lenses 202 are each disposed in a third gap 201 provided between the plurality of first intra-layer lenses 120 adjacent in the direction of the opposite sides of the pixel 10 in plan view with respect to the first surface 20. The third intra-layer lenses 202 are each disposed at a position overlapping with the adjacent first microlenses 133. The third intra-layer lenses 202 are each disposed at a position overlapping with the adjacent pixels 10.

As shown in FIG. 5B, the pixel region 2 includes the third intra-layer lenses 202 each disposed in the third gap 201 provided between the plurality of first intra-layer lenses 120 adjacent in the direction of the opposite sides of the pixel 10. The third intra-layer lenses 202 are disposed below a fourth gap 203 provided between the plurality of first microlenses 133 adjacent in the direction of the opposite sides of the pixel 10. At least one of an end (the upper end) of each third intra-layer lens 202 adjacent to the planarizing layer 123 and an end (the lower end) adjacent to the substrate 100 is disposed within a depth between an end of each first intra-layer lens 120 adjacent to the planarizing layer 123 and an end adjacent to the substrate 100.

Referring to FIGS. 5A and 5B, each third intra-layer lens 202 is disposed between the adjacent first photoelectric converters 101 in plan view with respect to the first surface 20. The third intra-layer lenses 202 are rounded rectangular in plan view with respect to the first surface 20 and are rounded rectangular in cross section as well.

Because of such a shape, the third intra-layer lenses 202 functions to collect incident light. The first intra-layer lenses 120, the second intra-layer lenses 121, and the third intra-layer lenses 202 may contain silicon nitride. The first intra-layer lenses 120, the second intra-layer lenses 121, and the third intra-layer lenses 202 may contain silicon oxynitride. In other words, the first intra-layer lenses 120, the second intra-layer lenses 121, and the third intra-layer lenses 202 may contain the same material.

Thus, in this embodiment, the flatness of the layer provided over the first intra-layer lenses 120 can be improved by disposing the second intra-layer lens 121 between the plurality of first intra-layer lenses 120 adjacent in the diagonal direction of the pixel 10. The layer provided over the first intra-layer lenses 120, whose flatness is improved, includes at least the first planarizing layer 123 and can further include the color filters 130, the second planarizing layer 131, and the first microlenses 133.

This embodiment further includes the third intra-layer lenses 202 between the plurality of first intra-layer lenses 120 adjacent in the direction of the opposite sides of the pixel 10, diagonal direction of the pixel 10 in addition to the second intra-layer lens 121 disposed between the plurality of first intra-layer lenses 120 adjacent in the diagonal direction of the pixel 10. This configuration decreases the spatial volumes of the first gaps 122 and the third gaps 201 to be planarized. This facilitates filling the first and third gaps 122 and 201 with the first planarizing layer 123, thereby improving the flatness of the layer provided over the first intra-layer lenses 120.

In this embodiment, the first intra-layer lenses 120, the color filters 130, and the first microlenses 133 are each disposed at about a center of each pixel 10, and the second intra-layer lenses 121 are each disposed between the first photoelectric converters 101. Alternatively, depending on the image heights of the pixels 10, the positions of the first intra-layer lenses 120, the color filters 130, and the first microlenses 133 may each be gradually disposed off the pixel center in plan view with respect to the first surface 20. The principal ray of an image capturing lens (not shown) is inclined with an increasing distance from the optical center of the photoelectric conversion apparatus. For this reason, the first intra-layer lenses 120, the color filters 130, and the first microlenses 133 may be disposed off the optical center.

In this embodiment, the second intra-layer lenses 121 are circular in plan view with respect to the first surface 20 and semicircular in cross sectional view. This is illustrative only. The shape of the second intra-layer lenses 121 can be selected based on the shape of the first intra-layer lenses 120 and the width of the first gap 122. Selecting a mask pattern based on the desired optical design allows for forming the first intra-layer lenses 120 and the second intra-layer lenses 121 with different shapes. The mask may be a binary mask or a gradation mask based on the pattern to be formed. In this embodiment, the second intra-layer lenses 121 and the third intra-layer lenses 202 are separately formed using a single pattern. Alternatively, the second intra-layer lenses 121 and the third intra-layer lenses 202 may be formed using a single pattern.

A photoelectric conversion apparatus according to a modification of the second embodiment of the present disclosure will be described with reference to FIGS. 6A to 6C. The components corresponding to those in the first and second embodiments are denoted by the same reference signs, and descriptions thereof may be omitted or simplified.

The modification of the second embodiment differs from the second embodiment in the shape of the second intra-layer lenses 121 and the third intra-layer lenses 202. FIGS. 6A and FIGS. 6B and 6C are examples of a plan view and a cross-sectional view of the pixel region of the photoelectric conversion apparatus according to this modification, respectively.

Figures 6A, 6B, 6C:
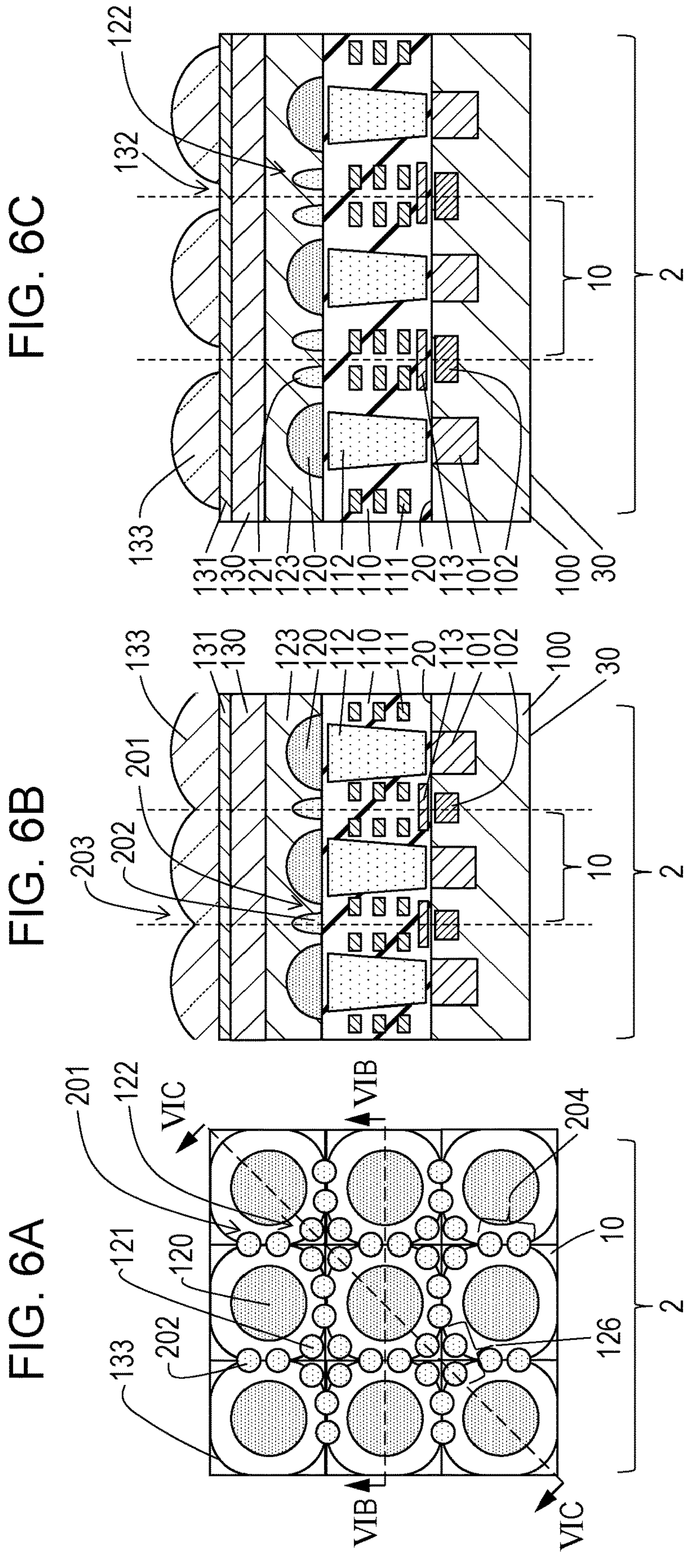
FIG. 6A is a plan view of a photoelectric conversion apparatus according to a modification of the second embodiment.
FIGS. 6B and 6C are cross-sectional views of the photoelectric conversion apparatus according to the modification of the second embodiment.

FIG. 6A illustrates an example of a plan view of the pixel region 2 seen from the first surface 20.

FIG. 6B illustrates an example of a cross-sectional view of the pixel region 2 of FIG. 6A taken along line VIB-VIB, which is the direction of the opposite sides of the pixel 10. FIG. 6C illustrates an example of a cross-sectional view of the pixel region 2 of FIG. 6A taken along line VIC-VIC, which is the direction of a diagonal of the pixel 10.

As shown in FIGS. 6A to 6C, the second intra-layer lenses 121 are each disposed in the first gap 122 provided between the plurality of first intra-layer lenses 120 adjacent in the diagonal direction of the pixel 10 in plan view with respect to the first surface 20. The third intra-layer lenses 202 are each disposed in a third gap 201 provided between the plurality of first intra-layer lenses 120 adjacent in the direction of the opposite sides of the pixel 10 in plan view with respect to the first surface 20. The second intra-layer lenses 121 and the third intra-layer lenses 202 are circular in plan view with respect to the first surface 20 and semicircular in cross-sectional view. The second intra-layer lenses 121 constitute a second intra-layer lens unit 126. The third intra-layer lenses 202 constitute a third intra-layer lens unit 204.

Thus, in this modification, the flatness of the layer provided over the first intra-layer lenses 120 can be improved by disposing the second intra-layer lens 121 between the plurality of first intra-layer lenses 120 adjacent in the diagonal direction of the pixel 10.

Furthermore, this modification selects appropriate shapes for the second intra-layer lenses 121 and the third intra-layer lenses 202 based on the shape of the first intra-layer lenses 120 in consideration of the lens volume and etching processability. This configuration decreases the spatial volumes of the first gaps 122 and the third gaps 201 to be planarized. This facilitates filling the first gaps 122 and the third gaps 201 with the first planarizing layer 123, thereby further improving the flatness of the layer provided over the first intra-layer lenses 120.

The number of the second intra-layer lenses 121 constituting the second intra-layer lens unit 126 and the number of the third intra-layer lenses 202 constituting the third intra-layer lens unit 204 may be any number.

Third Embodiment

A photoelectric conversion apparatus according to a third embodiment of the present disclosure will be described with reference to FIGS. 7A to 7C. The components corresponding to those in the first and second embodiments are denoted by the same reference signs, and descriptions thereof may be omitted or simplified.

This embodiment differs from the first and second embodiments in the layout of the first intra-layer lenses 120. FIGS. 7A and FIGS. 7B and 7C are examples of a plan view and a cross-sectional view of the pixel region of the photoelectric conversion apparatus according to this embodiment, respectively.

Figures 7A, 7B, 7C:
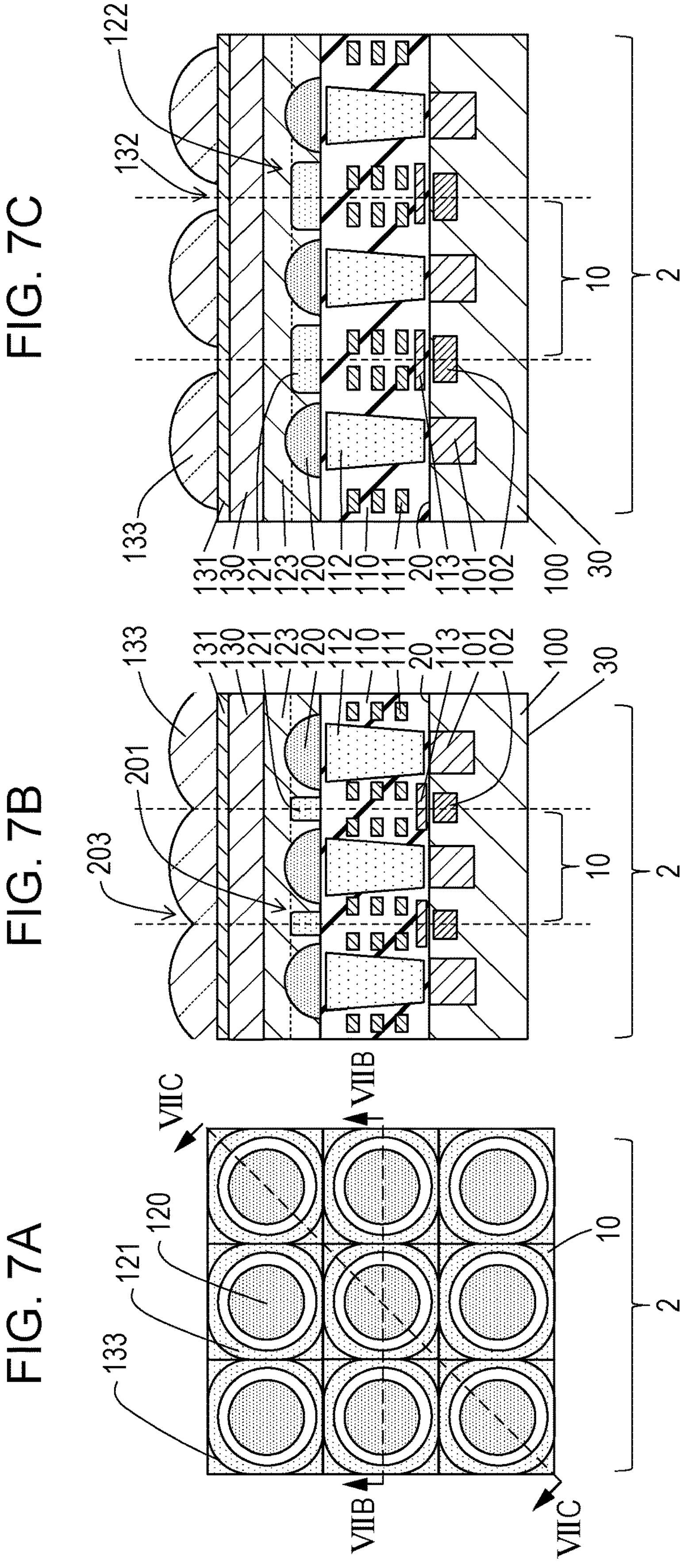
FIG. 7A is a plan view of a photoelectric conversion apparatus according to a third embodiment.
FIGS. 7B and 7C are cross-sectional views of the photoelectric conversion apparatus according to the third embodiment.

FIG. 7A illustrates an example of a plan view of the pixel region 2 seen from the first surface 20.

FIG. 7B illustrates an example of a cross-sectional view of the pixel region 2 of FIG. 7A taken along line VIIB-VIIB, which is the direction of the opposite sides of the pixel 10. FIG. 7C illustrates an example of a cross-sectional view of the pixel region 2 of FIG. 7A taken along line VIIC-VIIC, which is the direction of a diagonal of the pixel 10.

As shown in FIGS. 7A to 7C, the first gap 122 is provided between the plurality of first intra-layer lenses 120 adjacent in the diagonal direction of the pixel 10 in plan view with respect to the first surface 20.

The third gap 201 is provided between the plurality of first intra-layer lenses 120 adjacent in the direction of the opposite sides of the pixel 10 in plan view with respect to the first surface 20. The second intra-layer lenses 121 are each disposed in the first gap 122 and the third gap 201 in plan view with respect to the first surface 20. In other words, the second intra-layer lenses 121 are each disposed so as to surround each first intra-layer lens 120 in plan view with respect to the first surface 20. The second intra-layer lenses 121 are each disposed below the second gap 132 provided between the plurality of first microlenses 133 adjacent in the diagonal direction of the pixel 10. The second intra-layer lenses 121 are each disposed below the fourth gap 203 provided between the plurality of first microlenses 133 adjacent in the direction of the opposite sides of the pixel 10. The second intra-layer lenses 121 are rounded rectangular in cross section and are disposed so as to increase in volume without obstructing the light incident on the first intra-layer lenses 120. Because of this configuration, the second intra-layer lenses 121 function to collect incident light.

Thus, in this embodiment, the flatness of the layer provided over the first intra-layer lenses 120 can be improved by disposing the second intra-layer lens 121 between the plurality of first intra-layer lenses 120 adjacent in the diagonal direction of the pixel 10. The layer provided over the first intra-layer lenses 120, whose flatness is improved, includes at least the first planarizing layer 123 and can further include the color filters 130, the second planarizing layer 131, and the first microlenses 133.

Furthermore, in this embodiment, the second intra-layer lenses 121 are disposed so as to increase in volume without obstructing the light incident on the first intra-layer lenses 120. This configuration decreases the spatial volumes of the first gaps 122 and the third gaps 201 to be planarized. This facilitates filling the first gaps 122 and the third gaps 201 with the first planarizing layer 123, thereby further improving the flatness of the layer provided over the first intra-layer lenses 120.

In this embodiment, the first intra-layer lenses 120, the color filters 130, and the first microlenses 133 are each disposed at about a center of each pixel 10, and the second intra-layer lenses 121 are each disposed between the first photoelectric converters 101. Alternatively, depending on the image heights of the pixels 10, the positions of the first intra-layer lenses 120, the color filters 130, and the first microlenses 133 may each be gradually disposed off the pixel center in plan view with respect to the first surface 20. The principal ray of an image capturing lens (not shown) is inclined with an increasing distance from the optical center of the photoelectric conversion apparatus. For this reason, the first intra-layer lenses 120, the color filters 130, and the first microlenses 133 may be disposed off the optical center.

Fourth Embodiment

A photoelectric conversion apparatus according to a fourth embodiment of the present disclosure will be described with reference to FIGS. 8A to 8C. The components corresponding to those in the first to third embodiments are denoted by the same reference signs, and descriptions thereof may be omitted or simplified.

This embodiment differs from the first to third embodiments in the layout of the wiring layer 110. In other words, the first to third embodiments illustrate examples of a front-illuminated photoelectric conversion apparatus. In contrast, this embodiment illustrates an example of a backside-illuminated photoelectric conversion apparatus. FIGS. 8A and FIGS. 8B and 8C are examples of a plan view and a cross-sectional view of the pixel region of the photoelectric conversion apparatus according to this embodiment, respectively.

This embodiment is a laminated backside-illuminated photoelectric conversion apparatus in which a pixel substrate (substrate 100) and a signal processing substrate are laminated. A pixel substrate provided in a non-laminated photoelectric conversion apparatus includes a pixel region 2 and a peripheral region 3 disposed around the pixel region 2. In contrast, in the laminated photoelectric conversion apparatus, the driving-signal generation circuit, the A/D conversion circuit for converting signals from analog to digital, and the output circuit for outputting the A/D converted signals are disposed on the laminated signal processing substrate (not shown). Since the configuration of the laminated photoelectric conversion apparatus is well known, a detailed configuration thereof will be omitted.

Figures 8A, 8B, 8C:
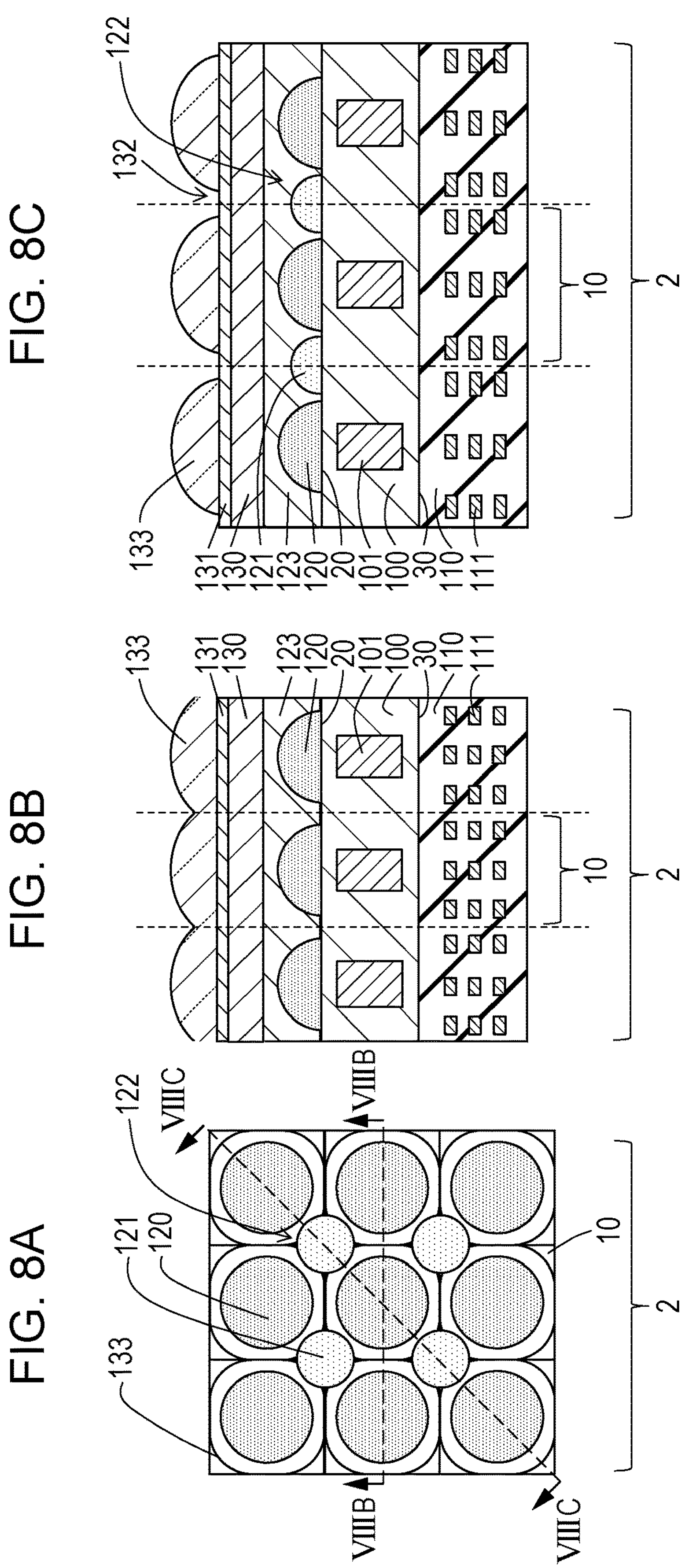
FIG. 8A is a plan view of a photoelectric conversion apparatus according to a fourth embodiment.
FIGS. 8B and 8C are cross-sectional views of the photoelectric conversion apparatus according to the fourth embodiment.

FIG. 8A illustrates an example of a plan view of the pixel region 2 seen from the first surface 20.

FIG. 8B illustrates an example of a cross-sectional view of the pixel region 2 of FIG. 8A taken along line VIIIB-VIIIB, which is the direction of the opposite sides of the pixel 10. FIG. 8C illustrates an example of a cross-sectional view of the pixel region 2 of FIG. 8A taken along line VIIIC-VIIIC, which is the direction of a diagonal of the pixel 10.

As shown in FIG. 8A, the second intra-layer lenses 121 are each disposed in the first gap 122 provided between the plurality of first intra-layer lenses 120 adjacent in the diagonal direction of the pixel 10 in plan view with respect to the first surface 20.

As shown in FIG. 8C, the pixel region 2 includes a substrate 100, a wiring layer 110 containing wiring lines 111, first intra-layer lenses 120, second intra-layer lenses 121, a first planarizing layer 123, and first microlenses 133. The first intra-layer lenses 120, the second intra-layer lenses 121, the first planarizing layer 123, and the first microlenses 133 are disposed adjacent to a first surface 20, which is a light incident surface. In contrast, the wiring layer 110 is disposed adjacent to a second surface 30 different from the first surface 20. The substrate 100 is disposed between the wiring layer 110 and the first intra-layer lenses 120.

The first intra-layer lenses 120 is disposed between the first planarizing layer 123 and the substrate 100. The first planarizing layer 123 is disposed between the first microlenses 133 and the substrate 100. The wiring lines 111 disposed remote from the second surface 30 (bottom in FIG. 8C) are electrically connected to wiring lines (not shown) contained in the laminated signal processing substrate.

Thus, this embodiment can improve the flatness of the layer provided over the first intra-layer lenses 120 by disposing the second intra-layer lenses 121 between the plurality of first intra-layer lenses 120 adjacent in the diagonal direction of the pixel 10. The layer provided over the first intra-layer lenses 120, whose flatness is improved, includes at least the first planarizing layer 123 and can further include the color filters 130, the second planarizing layer 131, and the first microlenses 133.

Furthermore, since this embodiment includes one or more circuits with different characteristics at different substrates, the substrates can be manufactured using appropriate processes for the one or more circuits. Furthermore, laminating the substrates allows reduction in the area of the photoelectric conversion apparatus.

In this embodiment, the first intra-layer lenses 120, the color filters 130, and the first microlenses 133 are each disposed at about a center of each pixel 10, and the second intra-layer lenses 121 are each disposed between the plurality of first photoelectric converters 101. Alternatively, depending on the image heights of the pixels 10, the positions of the first intra-layer lens 120, the color filter 130, and the first microlens 133 may be gradually disposed off the pixel center in plan view with respect to the first surface 20. The principal ray of an image capturing lens (not shown) is inclined with an increasing distance from the optical center of the photoelectric conversion apparatus. For this reason, the first intra-layer lens 120, the color filter 130, and the first microlens 133 may be disposed off the optical center.

In this embodiment, the second intra-layer lenses 121 are circular in plan view with respect to the first surface 20 and semicircular in cross sectional view. This is illustrative only. The shape of the second intra-layer lenses 121 can be selected based on the shape of the first intra-layer lenses 120 and the width of the first gap 122. Selecting a mask pattern based on the desired optical design allows for forming the first intra-layer lenses 120 and the second intra-layer lenses 121 with different shapes. The mask may be a binary mask or a gradation mask based on the pattern to be formed.

A photoelectric conversion apparatus according to a modification of the fourth embodiment of the present disclosure will be described with reference to FIGS. 9A to 9C. The components corresponding to those in the first to fourth embodiments are denoted by the same reference signs, and descriptions thereof may be omitted or simplified.

The modification of the fourth embodiment differs from the fourth embodiment in that second photoelectric converters 401 are provided in addition to the first photoelectric converters 101. FIGS. 9A and FIGS. 9B and 9C are examples of a plan view and a cross-sectional view of the pixel region of the photoelectric conversion apparatus according to this modification, respectively.

Figures 9A, 9B, 9C:
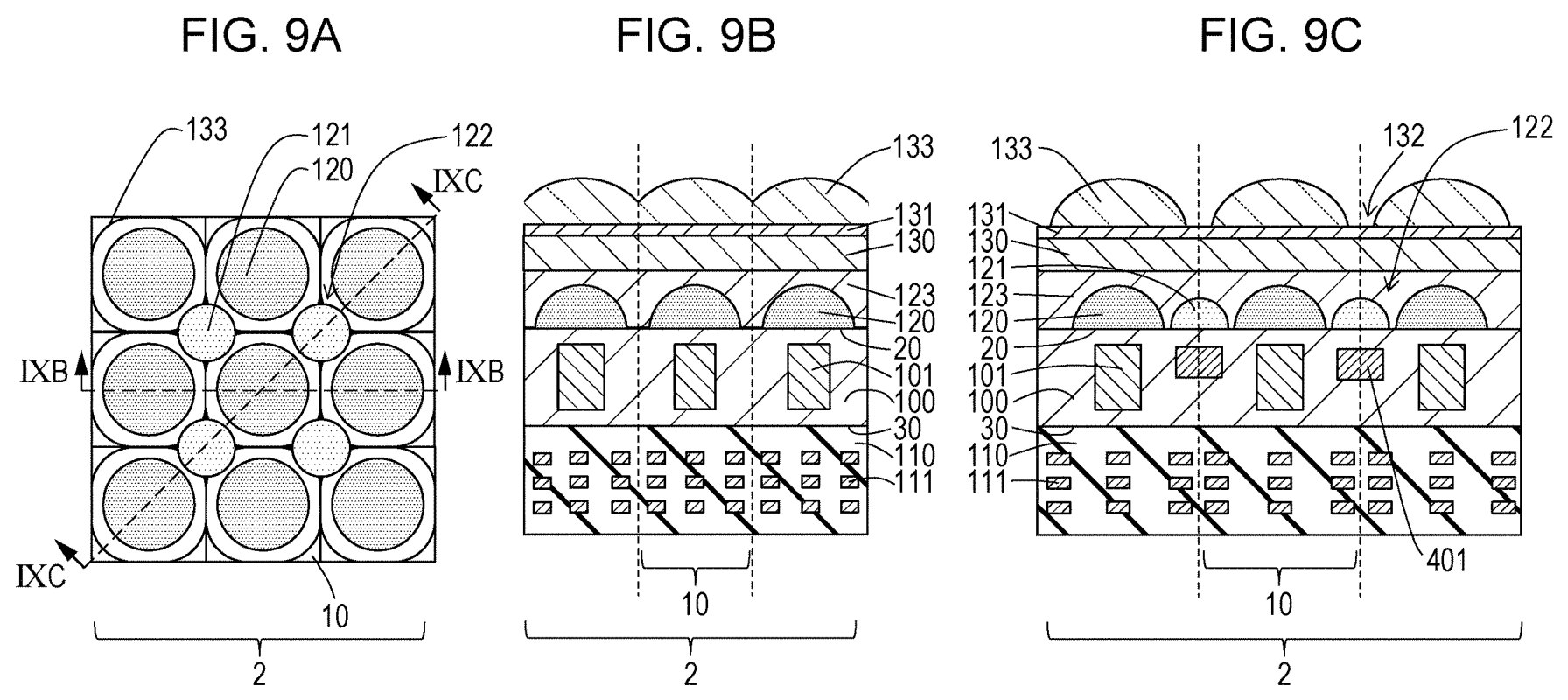

FIG. 9A illustrates an example of a plan view of the pixel region 2 seen from the first surface 20.

FIG. 9B illustrates an example of a cross-sectional view of the pixel region 2 of FIG. 9A taken along line IXB-IXB, which is the direction of the opposite sides of the pixel 10. FIG. 9C illustrates an example of a cross-sectional view of the pixel region 2 of FIG. 9A taken along line IXC-IXC, which is the direction of a diagonal of the pixel 10.

As shown in FIGS. 9A to 9C, the second intra-layer lenses 121 are each disposed in the first gap 122 provided between the plurality of first intra-layer lenses 120 adjacent in the diagonal direction of the pixel 10 in plan view with respect to the first surface 20. The second photoelectric converters 401 are each disposed between the adjacent first photoelectric converters 101. The second photoelectric converters 401 are each disposed between the adjacent first microlenses 133 in plan view with respect to the first surface 20. The second photoelectric converters 401 are each disposed between the adjacent first intra-layer lenses 120 in plan view with respect to the first surface 20. The second intra-layer lenses 121 are each disposed at a position overlapping with at least part of each second photoelectric converter 401 in plan view with respect to the first surface 20. In other words, this modification includes the second photoelectric converters 401 corresponding to the second intra-layer lenses 121 in addition to the first photoelectric converters 101 corresponding to the first intra-layer lenses 120. The area of the second photoelectric converter 401 may be smaller than the area of the first photoelectric converter 101 in plan view with respect to the first surface 20. The volume of the second photoelectric converter 401 may be smaller than the volume of the first photoelectric converter 101

Thus, in this modification, the flatness of the layer provided over the first intra-layer lenses 120 can be improved by disposing the second intra-layer lens 121 between the plurality of first intra-layer lenses 120 adjacent in the diagonal direction of the pixel 10.

This modification allows for improving the flatness of the layer provided over the first intra-layer lenses 120 in various pixel arrays.

In this modification, second microlenses 403 may each be disposed between the plurality of first microlenses 133 adjacent in the diagonal direction of the pixel 10. This configuration will be described with reference to FIGS. 10A to 10C. Providing the second microlenses 403 allows for efficiently collecting the light incident on the second photoelectric converters 401.

Figures 10A, 10B, 10C:
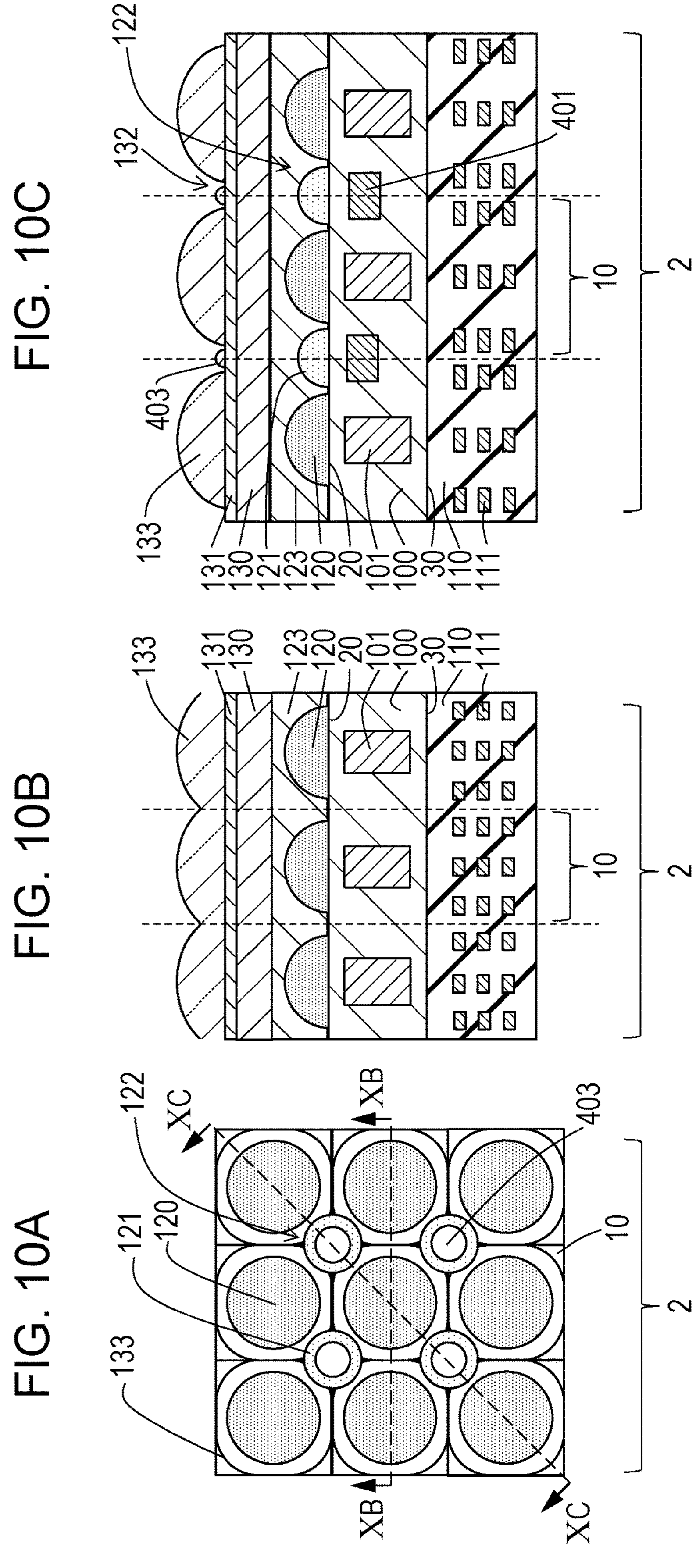
FIG. 10A is a plan view of a photoelectric conversion apparatus according to a modification of the fourth embodiment.
FIGS. 10B and 10C are cross-sectional views of the photoelectric conversion apparatus according to the modification of the fourth embodiment.

FIG. 10A illustrates an example of a plan view of the pixel region 2 seen from the first surface 20. FIG. 10B illustrates an example of a cross-sectional view of the pixel region 2 of FIG. 10A taken along line XB-XB, which is the direction of the opposite sides of the pixel 10. FIG. 10C illustrates an example of a cross-sectional view of the pixel region 2 of FIG. 10A taken along line XC-XC, which is the direction of a diagonal of the pixel 10.

As shown in FIGS. 10A to 10C, the second microlenses 403 are each disposed in the second gap 132 provided between the plurality of first microlenses 133 adjacent in the diagonal direction of the pixel 10 in plan view with respect to the first surface 20. The second microlenses 403 are each disposed between the adjacent first intra-layer lenses 120 in plan view with respect to the first surface 20. The second microlens 403 are each disposed at a position overlapping with at least part of the second intra-layer lens 121 in plan view with respect to the first surface 20. The second microlenses 403 are each disposed at a position overlapping with at least part of the second photoelectric converter 401 in plan view with respect to the first surface 20. The area of the second microlens 403 may be smaller than the area of the first microlenses 133 in plan view with respect to the first surface 20. The volume of the second microlens 403 may be smaller than the volume of the first microlens 133. The second photoelectric converters 401 and the second microlenses 403 are also applicable to the front-illuminated photoelectric conversion apparatuses illustrated in the first to third embodiments.

Fifth Embodiment

Figure 11A:
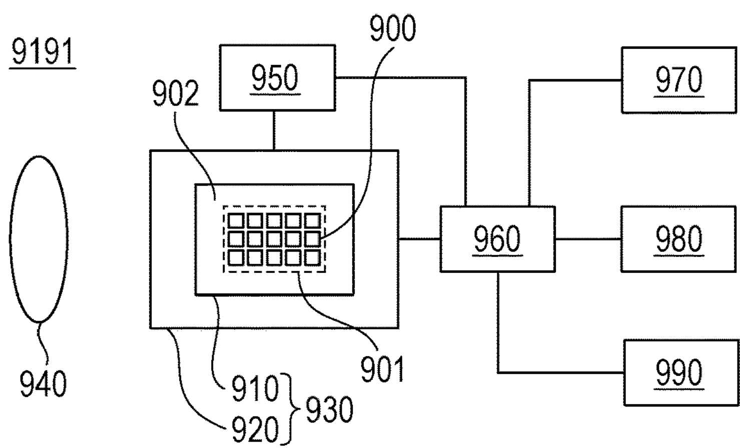
FIGS. 11A to 11C are schematic diagrams illustrating equipment according to a fifth embodiment.

A fifth embodiment is applicable to any of the first to fourth embodiments. FIG. 11A is a schematic diagram illustrating equipment 9191 including a semiconductor apparatus 930 of this embodiment. The semiconductor apparatus 930 may include the photoelectric conversion apparatus of each embodiment. The equipment 9191 including the semiconductor apparatus 930 will be described in detail. The semiconductor apparatus 930 may include a semiconductor device 910. The semiconductor apparatus 930 can include, in addition to the semiconductor device 910, a package 920 for housing the semiconductor device 910. The package 920 can include a substrate to which the semiconductor device 910 is fixed and a cover, such as glass, facing the semiconductor device 910. The package 920 can further include a bonding member, such as a bonding wire or bump, that bonds a terminal provided at the substrate and a terminal provided at the semiconductor device 910 together.

The equipment 9191 may include at least one of an optical device 940, a controller 950, a processor 960, a display 970, a storage 980, and a mechanical device 990. The optical device 940 is provided for the semiconductor apparatus 930. Examples of the optical device 940 include a lens, a shutter, and a mirror and include an optical system that guides light to the semiconductor apparatus 930. The controller 950 controls the semiconductor apparatus 930. One example of the controller 950 is a semiconductor apparatus, such as an application specific integrated circuit (ASIC).

The processor 960 processes signals output from the semiconductor apparatus 930. The processor 960 is a semiconductor apparatus, such as a central processing unit (CPU) or an ASIC, constituting an analog front end (AFE) or a digital front end (DFE). Examples of the display 970 include an electroluminescence (EL) display and a liquid crystal display that display information (images) obtained by the semiconductor apparatus 930. Examples of the storage 980 include a magnetic device and a semiconductor device that store information (images) obtained by the semiconductor apparatus 930. Examples of the storage 980 include volatile memories, such as a static random access memory (SRAM) and a dynamic random access memory (DRAM), and non-volatile memories, such as a flash memory and a hard disk drive.

The mechanical device 990 includes a movable portion or a propulsive portion, such as a motor and an engine. The equipment 9191 displays signals output from the semiconductor apparatus 930 on the display 970 or transmits the signals to the outside with a communication device (not shown) of the equipment 9191. For this purpose, the equipment 9191 may further include the storage 980 and the processor 960, in addition to a memory circuit and an arithmetic circuit of the semiconductor apparatus 930. The mechanical device 990 may be controlled based on the signals output from the semiconductor apparatus 930.

The equipment 9191 is also suitable for electronic equipment, such as information terminals (for example, smartphones and wearable terminals) having a photographing function and cameras (for example, cameras with interchangeable lenses, compact cameras, video cameras, and monitoring cameras). The mechanical device 990 in cameras can drive the components of the optical device 940 for zooming, focusing, and shutter operations. Alternatively, the mechanical device 990 in cameras can move the semiconductor apparatus 930 for image stabilization.

Other examples of the equipment 9191 include transport equipment, such as vehicles, marine vessels, and flight vehicles (for example, drones and aircrafts). The mechanical device 990 in the transport equipment is used as a moving apparatus. The equipment 9191 serving as transport equipment is suitable for transporting the semiconductor apparatus 930 or assisting and/or automating the driving using a photographing function. The processor 960 for assisting and/or automating driving (controlling) can perform processing for operating the mechanical device 990 serving as a moving apparatus based on information obtained by the semiconductor apparatus 930. Other examples of the equipment 9191 include medical equipment, such as endoscopes, measurement equipment, such as range sensors, analytical equipment, such as electron microscopes, business equipment, such as copying machines, and industrial equipment, such as robots.

The above embodiments allow providing desired pixel characteristics. This therefore enhances the value of the semiconductor apparatuses. Enhancing the value includes at least one of adding functions, improving the characteristics and the reliability, increasing the fabrication yield, and reducing the environment load, the cost, the size, and the weight.

Accordingly, using the semiconductor apparatus 930 according to this embodiment in the equipment 9191 may increase the value of the equipment. For example, mounting the semiconductor apparatus 930 in the transport equipment provides superior performance in photographing the outside of the transport equipment or measuring the external environment. Accordingly, mounting the semiconductor apparatus according to this embodiment in transport equipment in manufacturing or selling the transport equipment is advantageous in enhancing the performance of the transport equipment itself. In particular, the semiconductor apparatus 930 is suitable for transport equipment that assists the driving and/or automated driving of the transport equipment using information obtained by the semiconductor apparatus.

A photoelectric conversion system and a movable object in this embodiment will be described with reference to FIGS. 11B and 11C.

Figure 11B:
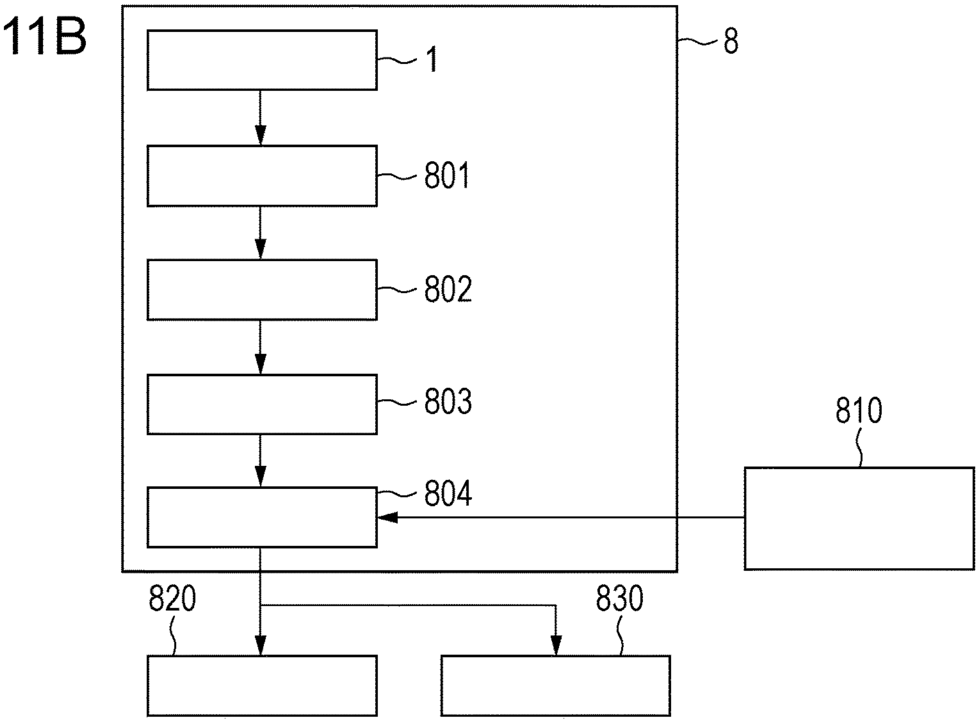

FIG. 11B illustrates an example of a photoelectric conversion system for car-mounted cameras. The photoelectric conversion system 8 includes a photoelectric conversion apparatus 1. The photoelectric conversion apparatus 1 is the photoelectric conversion apparatus (image capturing apparatus) according to one of the above embodiments. The photoelectric conversion system 8 includes an image processing unit 801 that performs image processing on a plurality of image data obtained by the photoelectric conversion apparatus 1 and a parallax acquisition unit 802 that calculates parallax (the phase difference between parallax images) from the plurality of image data obtained by the photoelectric conversion system 8. The photoelectric conversion system 8 may include an optical system (not shown), for example, a lens, a shutter, and a mirror, that guides light to the photoelectric conversion apparatus 80. The pixels of the photoelectric conversion apparatus 80 may include a plurality of photoelectric converters that is substantially conjugate to the pupil of the optical system. For example, the plurality of photoelectric converters that is substantially conjugate to the pupil is disposed in correspondence with one microlens. The plurality of photoelectric converters receives light that has passed through different positions of the pupil of the optical system, so that the photoelectric conversion apparatus 80 outputs image data corresponding to the light that has passed through the different positions. The parallax acquisition unit 802 may calculate the parallax using the output image data. The photoelectric conversion system 8 further includes a distance acquisition unit 803 that calculates the distance to the object based on the calculated parallax and a collision determination unit 804 that determines whether there is possibility of collision based on the calculated distance. The parallax acquisition unit 802 and the distance acquisition unit 803 are examples of a distance-information acquisition unit that obtains information on the distance to the object. In other words, the distance information is information about the parallax, the defocusing amount, the distance to the object, and the like. The collision determination unit 804 may determine whether collision can occur using any of the distance information. The distance information may be obtained by Time of Flight (ToF). The distance-information acquisition unit may be implemented by either specifically designed hardware or a software module. Alternatively, the distance-information acquisition unit may be implemented by a field programmable gate array (FPGA), an ASIC, or a combination thereof.

The photoelectric conversion system 8 is connected to a vehicle-information acquisition unit 810, thereby obtaining vehicle information such as vehicle speed, yaw rate, and steering angle. The photoelectric conversion system 8 is also connected to an electronic control unit (ECU) 820, which is a control unit that outputs a control signal for causing the vehicle to generate a braking force in response to the determination result of the collision determination unit 804. The photoelectric conversion system 8 is also connected to a warning device 830 that warns the driver in response to the determination result of the collision determination unit 804. For example, if there is a high collision possibility as a result of the determination of the collision determination unit 804, the ECU 820 performs vehicle control to avoid the collision or reduce damage by applying a brake, returning the accelerator, or decreasing the engine output. The warning device 830 warns the user, for example, gives a sound warning, displays warning information on the screen of a car navigation system or the like, or vibrates the seat belt or the steering.

In this embodiment, images in the area around the vehicle, for example, in front or rear, are captured by the photoelectric conversion system 8.

Figure 11C:
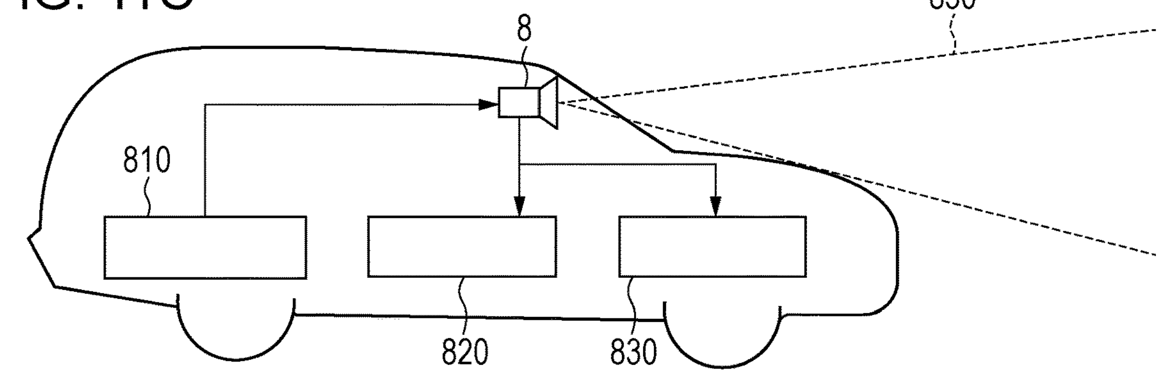

FIG. 11C illustrates the photoelectric conversion system 8 when capturing an image in front of the vehicle (an imaging area 850). The vehicle-information acquisition unit 810 issues instructions to the photoelectric conversion system 8, or the photoelectric conversion apparatus 1. This configuration increases the accuracy of ranging.

While the above example describes control for avoiding collision with another vehicle, the present disclosure is also applicable to control for autonomous driving following another vehicle and control for autonomous driving that prevents deviation from lanes. Furthermore, the photoelectric conversion system 8 is applicable not only to vehicles, such as automobiles, but also to movable objects (movable apparatus), such as marine vessels, aircrafts, and industrial robots. In addition, the photoelectric conversion system 8 is extensively applicable not only to movable objects but also to equipment that uses object recognition, such as an integrated transport system (ITS).

In this specification, the expressions, “A or B”, “at least one of A and B”, “at least one of A or/and B”, and “one or more of A and/or B” can include all combinations of enumerated items unless otherwise explicitly defined. In other words, it is to be understood that the above expressions include all of a case where at least one A is included, a case where at least one B is included, and a case where both of at least one A and at least one B are included. This also applies to a combination of three or more components.

The above embodiments can be modified as appropriate without departing from the technical spirit and scope of the disclosure. The disclosure in this specification encompasses not only what is described in this specification but also all matters discernible from this specification and the drawings attached to this specification. The disclosure in this specification includes a complement set of concepts described in this specification. In other words, if there is a statement in this specification, for example, that “A is larger than B”, this specification discloses that “A is not larger than B” even if the description “A is not larger than B” is omitted. This is because the description “A is larger than B” is based on the premise that the case of “A is not larger than B” is taken into account.

According to the embodiments of the present disclosure, the flatness of the layer provided over the intra-layer lenses can be improved.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2023-045117, filed Mar. 22, 2023, which is hereby incorporated by reference herein in its entirety.

What is claimed is:

1. A photoelectric conversion apparatus comprising:

a substrate including a first surface and a second surface, wherein the substrate is provided with a plurality of pixels, each including a first photoelectric converter between the first surface and the second surface;

a planarizing layer adjacent to the first surface of the substrate;

a first intra-layer lens between the planarizing layer and the substrate; and a second intra-layer lens between the planarizing layer and the substrate, wherein the first intra-layer lens is located at a position overlapping with at least part of the first photoelectric converter in a plan view with respect to the first surface, wherein at least part of the second intra-layer lens is located within a depth between an upper end and a lower end of the first intra-layer lens, and wherein the second intra-layer lens is disposed between a plurality of the first photoelectric converters adjacent to each other in the plan view with respect to the first surface, and the second intra-layer lens further is disposed in a direction of an extension of a diagonal of one of the plurality of pixels in the plan view with respect to the first surface.

2. The photoelectric conversion apparatus according to claim 1, further comprising a plurality of first microlenses adjacent to the first surface of the substrate, wherein the planarizing layer is disposed between the plurality of first microlenses and the substrate.

3. The photoelectric conversion apparatus according to claim 2, wherein one of the plurality of first microlenses is disposed at a position overlapping with at least part of the first intra-layer lens and at least part of the second intra-layer lens in the plan view with respect to the first surface.

4. The photoelectric conversion apparatus according to claim 2, wherein the second intra-layer lens is disposed between two adjacent first microlenses of the plurality of first microlenses in the plan view with respect to the first surface.

5. The photoelectric conversion apparatus according to claim 1, wherein at least part of the second intra-layer lens and the extension of the diagonal overlap with each other in the plan view with respect to the first surface.

6. The photoelectric conversion apparatus according to claim 1, wherein the second intra-layer lens is disposed at a position overlapping with two adjacent pixels of the plurality of pixels in the plan view with respect to the first surface.

7. The photoelectric conversion apparatus according to claim 1, wherein the first intra-layer lens and the second intra-layer lens include a convex lens.

8. The photoelectric conversion apparatus according to claim 1, further comprising a wiring layer between the first intra-layer lens and the substrate.

9. The photoelectric conversion apparatus according to claim 8, further comprising an optical waveguide in the wiring layer, wherein the first intra-layer lens is disposed at a position overlapping with at least part of the optical waveguide in the plan view with respect to the first surface.

10. The photoelectric conversion apparatus according to claim 8, further comprising a light-shielding film in the wiring layer, wherein the second intra-layer lens is disposed at a position overlapping with at least part of the light-shielding film in the plan view with respect to the first surface.

11. The photoelectric conversion apparatus according to claim 1, further comprising a charge accumulation unit in the substrate, wherein the second intra-layer lens is disposed at a position overlapping with at least part of the charge accumulation unit in the plan view with respect to the first surface.

12. The photoelectric conversion apparatus according to claim 1, wherein the second intra-layer lens includes a plurality of second intra-layer lenses constituting a lens unit.

13. The photoelectric conversion apparatus according to claim 1, further comprising a third intra-layer lens disposed between a plurality of the first photoelectric converters adjacent to each other in the plan view with respect to the first surface, wherein the third intra-layer lens is disposed in a direction of opposite sides of the plurality of pixels in the plan view with respect to the first surface.

14. The photoelectric conversion apparatus according to claim 1, further comprising a wiring layer adjacent to the second surface of the substrate.

15. The photoelectric conversion apparatus according to claim 1, further comprising a second photoelectric converter between a plurality of the first photoelectric converters adjacent to each other, wherein the second intra-layer lens is disposed at a position overlapping with at least part of the second photoelectric converter in the plan view with respect to the first surface.

16. The photoelectric conversion apparatus according to claim 15, further comprising:

a plurality of first microlenses adjacent to the first surface of the substrate; and a second microlens between two adjacent first microlenses of the plurality of first microlenses, wherein the second microlens is disposed at a position overlapping with at least part of the second intra-layer lens or at least part of the second photoelectric converter in the plan view with respect to the first surface.

17. The photoelectric conversion apparatus according to claim 1, wherein the planarizing layer contains resin or silicon.

18. The photoelectric conversion apparatus according to claim 1, further comprising a color filter adjacent to the first surface of the substrate, wherein the planarizing layer is disposed between the color filter and the first intra-layer lens.

19. The photoelectric conversion apparatus according to claim 1, wherein an upper end and a lower end of the second intra-layer lens are located within a depth between the upper end and the lower end of the first intra-layer lens.

20. The photoelectric conversion apparatus according to claim 1, wherein a diameter of the second intra-layer lens is less than or equal to a diameter of the first intra-layer lens in the plan view with respect to the first surface.

21. Equipment comprising:

the photoelectric conversion apparatus according to claim 1; and at least one of the following:

an optical device configured to guide light to the photoelectric conversion apparatus, a controller configured to control the photoelectric conversion apparatus, a processor configured to process a signal output from the photoelectric conversion apparatus, a display configured to display information obtained by the photoelectric conversion apparatus, a storage configured to store the information obtained by the photoelectric conversion apparatus, or a mechanical device configured to operate based on the information obtained by the photoelectric conversion apparatus.

* * * * *